United States Patent [19]

Ogoshi

[11] Patent Number: 5,248,575
[45] Date of Patent: Sep. 28, 1993

[54] PHOTOMASK WITH PHASE SHIFTER AND METHOD OF FABRICATING SEMICONDUCTOR DEVICE BY USING THE SAME

[75] Inventor: Ken Ogoshi, Suwa, Japan

[73] Assignee: Seiko Epson Corporation, Tokyo, Japan

[21] Appl. No.: 773,544

[22] Filed: Oct. 9, 1991

[30] Foreign Application Priority Data

Oct. 12, 1990 [JP] Japan .................................. 2-273624

[51] Int. Cl.⁵ .................................................. G03F 9/00
[52] U.S. Cl. .......................................... 430/5; 430/311; 430/319
[58] Field of Search ........................... 430/5, 311, 319

[56] References Cited

U.S. PATENT DOCUMENTS

5,045,417  9/1991  Okamoto .................................. 430/5

Primary Examiner—Marion E. McCamish
Assistant Examiner—Mark A. Chapman
Attorney, Agent, or Firm—Oliff & Berridge

[57] ABSTRACT

A photomask has a light shielding layer and a phase shifter based on a phase shift method, both of which are mounted on a mask substrate. The light shielding layer is shaped in a light shielding pattern, having light passing regions beside its opposite sides. The phase shifter is made by thinning the mask substrate at a portion associated with one of the light passing regions. An optical path through the phase shifter is shorter than the optical path of the other light passing region, thereby shifting the phase of light.

13 Claims, 10 Drawing Sheets

PHOTOMASK WITH PHASE SHIFTER AND METHOD OF FABRICATING SEMICONDUCTOR DEVICE BY USING THE SAME

BACKGROUND OF THE INVENTION

1. Field of the Invention

This invention relates to a photomask with a phase shifter which uses a photolithographic phase shift technique to manufacture semiconductors, and a method of fabricating semiconductor devices by using such a photomask.

2. Description of the Related Art

With semiconductor device fabrication, remarkable able progress has been made in manufacture more minute components. In photolithography, an optical stepper is improved to increase the numerical aperture, and an exposing source is also improved to use shorter wavelengths. Refined and sophisticated resists also contribute to make more minute semiconductor devices. A photo-processing technique established for the manufacture of semiconductor devices uses a half-micron process rule, to take advantage of the improvement of the foregoing techniques.

The more the numerical aperture is increased to cope with the foregoing trend, the less the focus tolerance of the optical stepper. Minimization of the components fabricated by a light exposure process is reaching its limit so that it will become more difficult to prepare resist patterns necessary for manufacturing semiconductor devices. This inconvenience is caused by the diffraction effect of light.

Figure 11A:
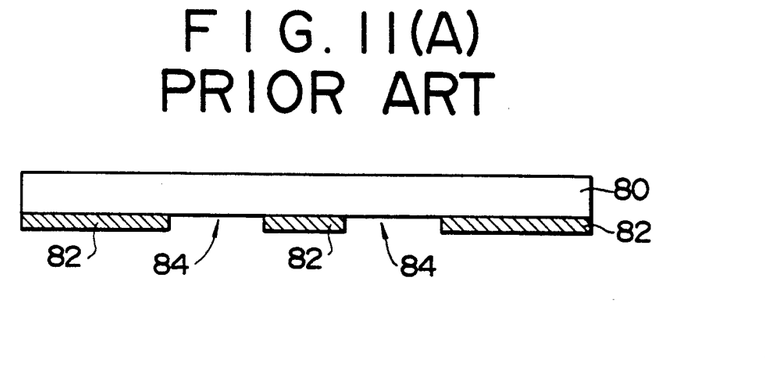
FIGS. 11(A) to 11(C) respectively show a cross section of a conventional photomask without using phase shift technique, and properties of light passing through the photomask.
Figure 11B:
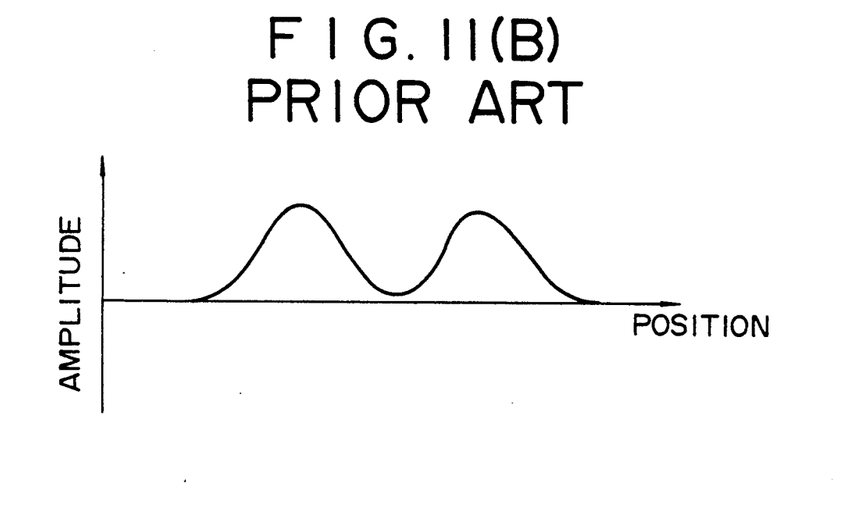
Figure 11C:
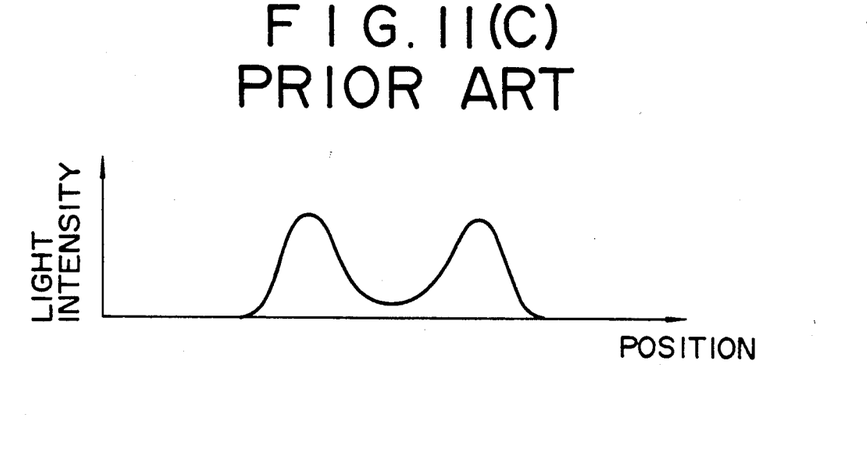

FIG. 11(A) of the accompanying drawings shows a cross-section of a photomask, also called a reticle, used with an optical stepper. The photomask comprises quartz glass 80, having a plurality of chromium patterns 82 for shielding light, and light passing regions 84 interposed between the chromium patterns 82. When the light passing regions 84 are densely packed for minimization of circuit patterns, rays of light on a wafer cannot be separated due to the diffraction effect of light. Specifically, light has the phase as shown in FIG. 11(B). Light intensity is equal to the square of the amplitude of the lightwave. When the adjacent patterns are densely packed, light intensity tends to appear at the shielded portion due to the diffraction effect, as shown in FIG. 11(C).

Figure 12A:
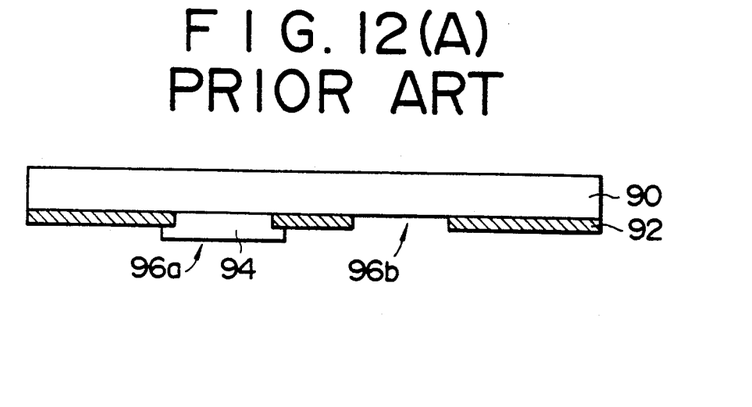
FIGS. 12(A) to 12(C) respectively show a cross section of a conventional photomask made by applying phase shift technique, and properties of light passing through the photomask.

A phase shift technique based on another feature of light has been developed recently as a novel method to further minimize semiconductor devices. FIG. 12(A) shows a cross-section of a photomask made by applying the phase shift technique. This photomask is characterized by a shifter 94 which is located at one of light passing regions 96a, 96b to shift the phase of light. The photomask made of quartz glass 90 has a plurality of chromium patterns 92. A resist compound is applied over the chromium patterns 92 so that the chromium patterns 92 are transferred to the resist by exposing an electron beam or laser beam and by development and etching processes.

Figure 12B:
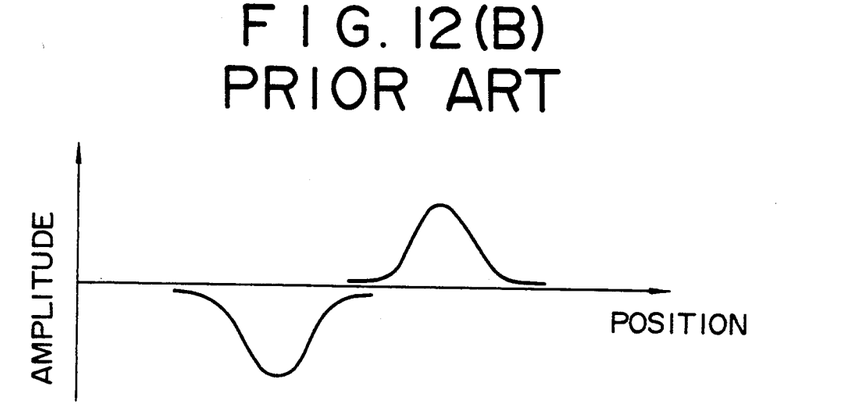
Figure 12C:
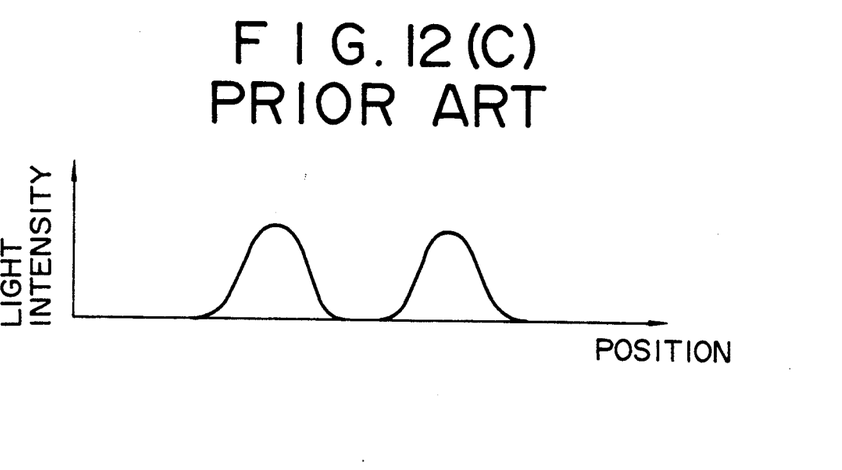

As shown in FIG. 12(B), the light passing through the photomask has a phase on a wafer which is reversed 180 degrees by the shifter 94 at the light passing region 96a. There is light having intensity due to the diffraction effect at a region shielded by the chromium pattern 92. However, since the intensity is equal to the square of amplitude of, the light intensity on the wafer is always zero between the adjacent light passing regions as shown in FIG. 12(C). The exposed and developed resist patterns are completely separated since the photomask made by applying the phase shift technique can provide very high resolution without difficulty.

Figure 13A:
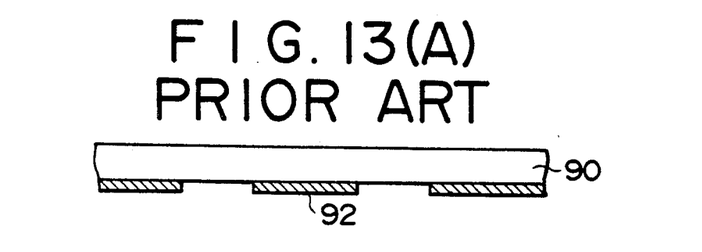
FIGS. 13(A) to 13(E) show a sequence to fabricate the photomask of FIGS. 12.
Figure 13B:
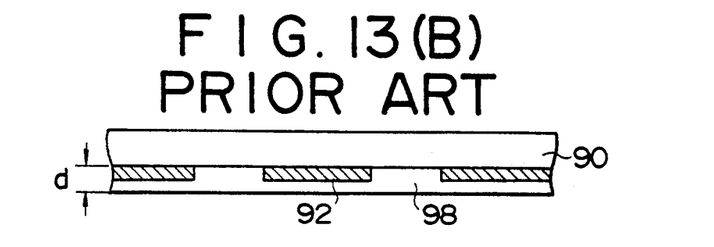

One of conventional methods to make photomasks by the phase shift technique is shown in FIGS. 13(A) to 13(E). FIG. 13(A) is a cross-sectional view of a photomask having chromium patterns 92 on quartz glass 90. SOG98 usually coated on the quartz glass 90 as material to make a shifter 94. Thickness d of SOG98 to shift the phase of light by 180 degrees is given by $$d = \lambda/[2 \times (n_1 - n_2)]$$

where $\lambda$ is a wavelength, $n_1$ is a refractive index of a shifter, and $n_2$ is a refractive index of an ambience around the photomask.

The refractive index $n_2$ is approximately 1 (one) when the photomask is placed in air. When g-ray of a mercury lamp is used as exposing light, the refractive index of SOG is 1.45. Since the g-ray has a wavelength of 0.436 $\mu$m, the thickness of the shifter 94 is 0.484 $\mu$m from the above equation.

Figure 13C:
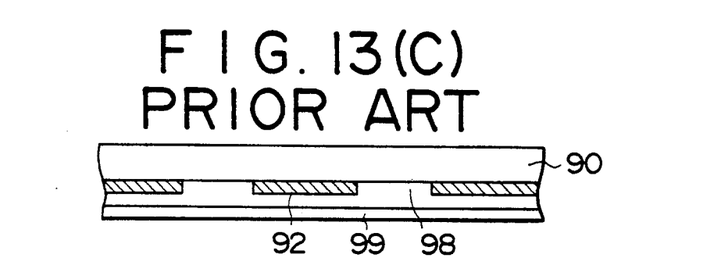
Figure 13D:
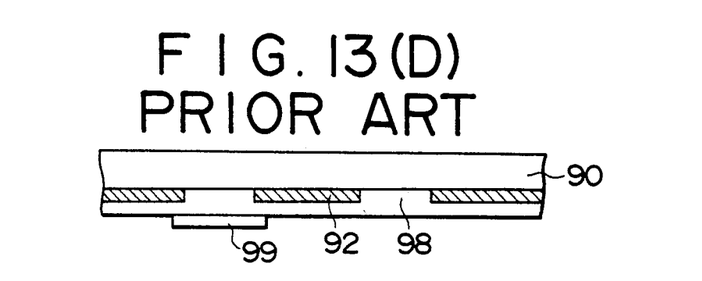
Figure 13E:
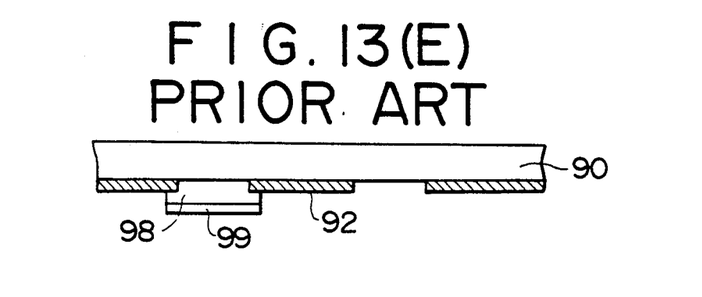

A resist 99 is coated on SOG98 the thickness d as shown in FIG. 13(C). Then an electron is applied to the resist 99 to draw and expose the chromium patterns 92, being developed as shown in FIG. 3(D). SOG98 undergoes dry etching through the resist 99 as a mask (FIG. 13(E)). Unnecessary resist 99 is stripped by sulphuric acid. Thus, a shifter 94 is obtained as shown in FIG. 12(A).

The foregoing conventional method has following drawbacks. SOG98 must be coated after forming the chromium patterns 92 on the quartz glass 90. The resist 99 must then coated on SOG98. After this, the printing, exposure, development and etching processes must be carried out. This means there are a number of steps to be taken to fabricate photomasks.

Coating of SOG98 not only increases the fabrication steps but also adversely affects determination of the precise thickness of the shifter 94. This is because SOG98 is usually applied over the quartz glass 90 and the chromium patterns 92 by spincoating. SOG98 cannot be uniformly coated on them since the chromium patterns 92 project from the quartz glass 90. The phase shift function of the shifter 94 depends upon the thickness of SOG98. Therefore, the shifter 94 of the conventional method suffers from varying phase shift because of non-uniform thickness of SOG98. The phase shift should be usually controlled in the range of 180°±10°. The conventional shifter 94 made by applying SOG98 satisfy this requirement.

SUMMARY OF THE INVENTION

It is therefore an object of this invention to provide a photomask which is made by applying the phase shift technique to decrease variation of phase shift related to a phase shifter.

Another object of this invention is to provide a photomask which can be fabricated using a decreased number of the manufacturing processes and assure an improved throughput with less expense.

A still further object of this invention is to provide a method of fabricating semiconductor devices with minute patterns formed precisely by exposing patterns through the photomask of this invention.

According to this invention, a shifter is formed by decreasing the thickness of a mask substrate at a position associated with a light passing region. The shifter has an optical path which is shorter than the optical path through a thick light passing region, thereby shifting the phase of light. This shifter differs from the conventional shifter which is formed by coating SOG98 on the mask substrate and is thickened to provide the optical path difference. The conventional shifter and this shifter are based on the same principle to differentiate the optical paths to shift the phase. However, no SOG is spin-coated to form the shifter in this invention, which decreases the number of processes for fabricating the photomasks. The optical path difference to reverse the phase depends upon the thickness of the flat mask substrate, which can be strictly controlled compared with the thickness of spincoated SOG. The thickness of the mask substrate is controlled during the etching process which is more reliable than spincoating.

When this invention is applied to fabrication of a photomask having a shifter for shielding light, the shifter is formed by thinning a mask substrate at a portion associated with one of the light passing regions near a light shielding layer. This thinned portion has an optical path which is shorter than the optical path of the other light passing regions, thereby shifting the phase of light. The phase shifter is formed as a recess in the shape of the pattern either on the surface of the mask substrate where the light shielding layer exists (hereinafter called "front surface"), or on the rear surface of the mask substrate. When the shifter is etched on the rear surface of the mask substrate, the light shielding layer is not side-etched, thereby improving the mask precision.

When this invention is applied to a photomask without a light shielding chromium layer, the shifter is formed by thinning the mask substrate. The optical path through the phase shifter is shorter than the optical path at the other portions of the mask substrate, thereby enabling phase shift. Intensity of light passing through the border between the phase shifter and the other portions becomes zero (0) since amplitude of light is offset at a portion where two light rays having different phases are superimposed. Therefore, the pattern can be exposed as desired. In this case, the phase shifter can be made by defining a recess on a surface of the mask substrate.

When this invention is applied to a photomask with edge-emphasized type shifters, shifters are formed by thinning the mask substrate associated with the opposite edges of the light passing regions. The optical path through the shifter is shorter than the centers of the light passing regions. The phase of light is shifted at the shifters to emphasize the edges of passing light and to increase the resolution. In this case, the phase shifter is formed on the front or rear surface of the mask substrate by thinning a portion of the mask substrate. When the rear surface of the mask substrate is etched to form a shifter recess, the light shielding layer will not be side-etched, thereby increasing its masking capability.

When this invention is applied to a photomask having auxiliary shifters, main light passing regions are formed beside light shielding patterns and auxiliary light passing regions are inside the side edges of the light shielding patterns.

In this case, phase shifters are positioned at the auxiliary light passing regions by decreasing the thickness of the mask substrate, differentiating lengths of optical paths through the main light passing regions to perform phase shift and enhance the light shielding effect of the light shielding patterns. The phase shifters are formed by etching either the front or rear surface of the mask substrate. When the phase shifters exist on the rear surface, the light shielding layer will not be side-etched, thereby increasing its masking capability.

In any of the foregoing photomasks, etching depth D of the phase shifter is given by $$D = (100 \pm 5.56)\% \times [\lambda / 2 \times (n_1 - n_2)]$$

where $\lambda$ is a wavelength of the exposing light, $n_1$ is a refractive index of said mask substrate, and $n_2$ is a refractive index of an ambience around said photomask. The phase of light can be substantially shifted in the range of $180° \pm 10°$.

For the photomask having a shifter for shielding light or the photomask without a light shielding layer, an i-ray of a mercury lamp may be used to expose the minute patterns excimer laser, having shorter wavelengths than the i-ray may also be used.

DETAILED DESCRIPTION

A photomask according to a first embodiment of this invention will be described with reference to FIG. 1 to FIG. 4.

Figure 1A:
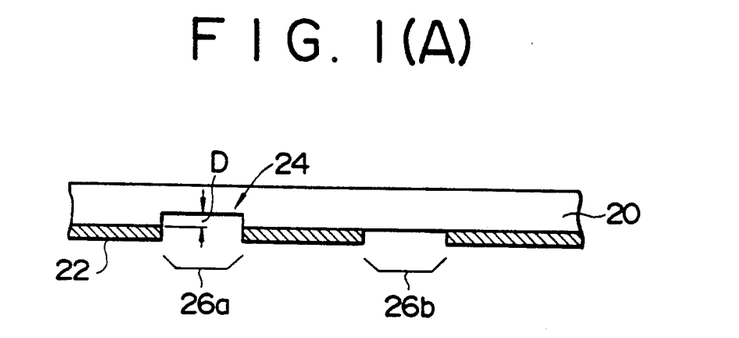
FIGS. 1(A) to 1(C) respectively show a cross section of a photomask having a shifter for shielding light according to a first embodiment of this invention, and properties of light passing through the shifter.

As shown in FIG. 1(A), a photomask comprises quartz glass 20 as a mask substrate (hereinafter called "mask substrate 20") and chromium circuit patterns 22 for making semiconductor devices, similar to a conventional photomask. Light passing regions 26a, 26b exist between the chromium patterns 22. A phase shifter 24 is formed at the light passing region 26a by etching the mask substrate 20 instead of coating SOG as in the conventional method. In other words, the mask substrate 20 is thinned to serve as the phase shifter 24 to shorten the optical path compared with the optical path through the light passing region 26b which has no shifter, thereby shifting the phase of light.

The etching depth D of the mask substrate 20 is given by $$D = \lambda[2 \times (1.45 - 1)]$$

where $\lambda$ is a wavelength of exposing light, the refractive index of the mask substrate 20 is 1.45, and the refractive index of air is 1.

The etching depth D is 0.484 $\mu$m if g-ray (wavelength: 0.436 $\mu$m) is used as the exposing light. The etching depth D is 0.406 $\mu$m for i-ray (wavelength: 0.365 $\mu$m). In any case, the etching depth D should be controlled within plus-minus 10% from these values. This is because the shifter 24 can shift the phase in the range of 180°±10°.

Figure 1B:
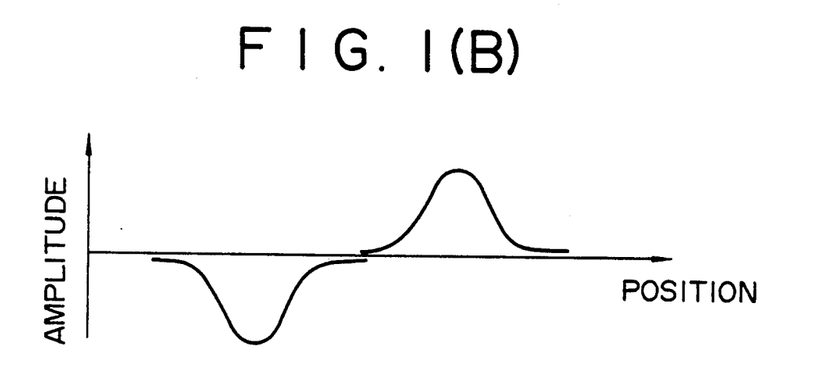
Figure 1C:
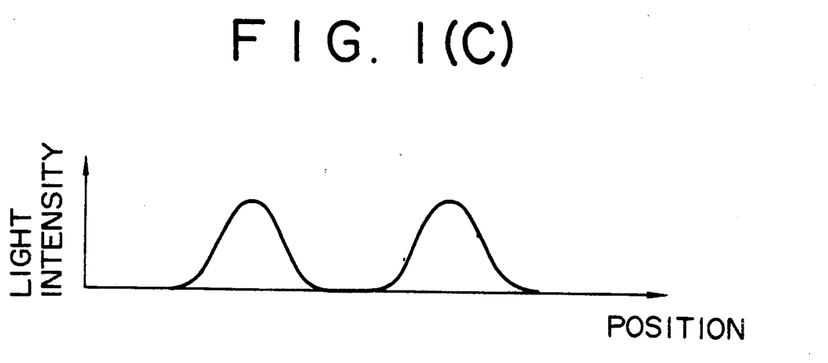

Light passing through the photomask has the phase and intensity as shown in FIGS. 1(B) and 1(C), respectively, so that minute patterns can be exposed. The pattern pitch is 0.5 $\mu$m at present. To realize a pattern pitch of 0.35 $\mu$m for more advanced semiconductor devices, an i-ray of a mercury lamp will be a very effective as the exposing light for the photomask based on the phase shift. In such a case, no excimer laser having shorter wavelengths will be required.

Fabrication of the photomask will be described referring to FIGS. 2(A) to 2(D). The chromium patterns 22 are first formed on the mask substrate 20 (FIG. 2(A)). Then light passing regions 26a, 26b are formed between the chromium patterns 22.

Figure 2A:
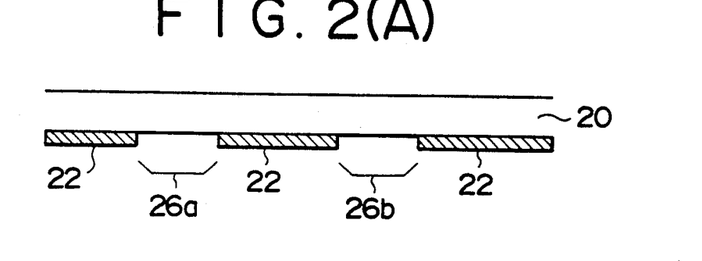
FIGS. 2(A) to 2(D) show a sequence for fabricating the photomask of FIGS. 1.
Figure 2B:
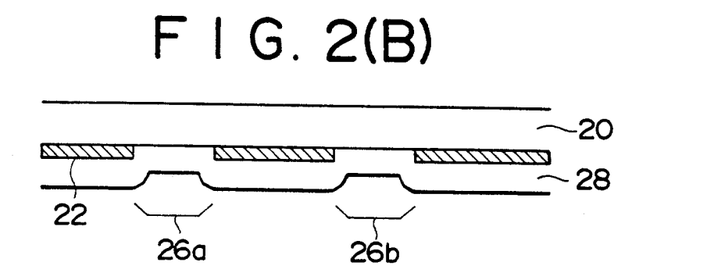

The substrate 20 and chromium patterns 22 are covered with a resist 28 to make a shifter at the light passing region 26a (FIG. 2(B)).

Figure 2C:
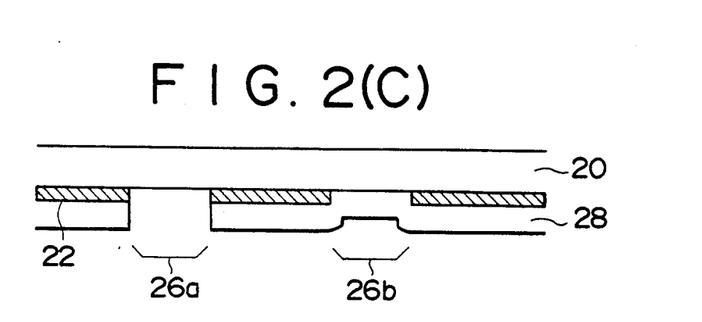

The resist 28 is printed and exposed by an electron beam drawing machine, and is then developed, so that the resist 28 is removed only from the light passing region 26a (FIG. 2(C)).

Figure 2D:
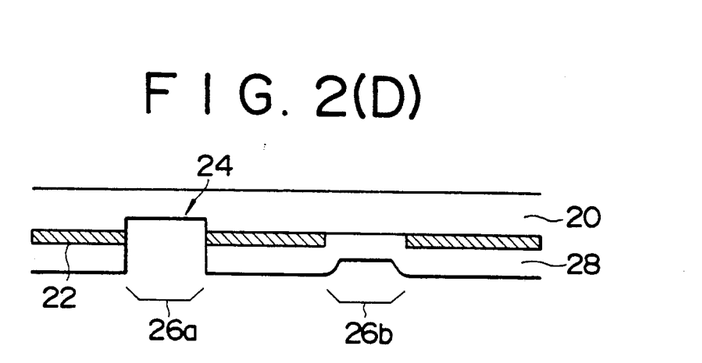

The mask substrate 20 is dry-etched by a mixed gas of chloro-fluoro carbon 14 ($CF_4$) and chloro-fluoro carbon 23 ($CHF_3$) through the resist 28 as a mask (FIG. 2(D)). Since the etching depth is proportional to the etching period, the desired etching depth D is determined by controlling the etching period. Firstly, etching is performed as a preparatory step until the composition of the mask substrate 20 is revealed. Secondly, an etching rate is calculated based on data obtained in the preparatory step to determine a period of time to attain the desired etching depth D. Otherwise, a laser beam is made obliquely incident on the etched portion so that the thickness of the substrate 20 is being measured by observing the reflected light on the real time basis to determine the time to stop etching.

The dry etching process can be also carried out by using a mixed gas of chloro-fluoro carbon 116 ($C_2F_3$) and chloro-fluoro carbon 23 ($CHF_3$), argon (Ar), chloro-fluoro carbon 14 ($CF_4$) and chloro-fluoro carbon 23 ($CHF_3$), or helium (He), oxide ($O_2$) and chloro-fluoro carbon 23 ($CHF_3$).

With the phase shift technique, the phase shift of the shifter should be controlled within the range of 180°±10°. According to this invention, since the photomask does not require coating of shifter material after formation of the chromium patterns 22 and undergoes the dry etching process which assures about 3% controllability for the etching depth, the shifter can control the phase shift within 180°±10°.

The resist is stripped by sulfuric acid after the dry etching process to obtain the photomask as shown in FIG. 1(A).

After the dry etching, the mask substrate 20 may be further subject to either dry etching or wet chemical etching to smooth the surface of the light passing region 26a. The wet chemical etching is carried out by steeping the mask substrate 20 for 10 seconds in a solution of hydrofluoric acid (HF) and water, or hydrofluoric acid (HF) and ammonium fluoride, all of which are mixed in the ratio of 1 to 100. For the drying etching, a gas of chloro-fluoro carbon 14 ($CF_4$), chloro-fluoro carbon 23 ($CHF_3$), hexasulfur fluoride ($SF_6$) or trinitrogen fluoride ($NF_3$) may be used.

Figure 3:
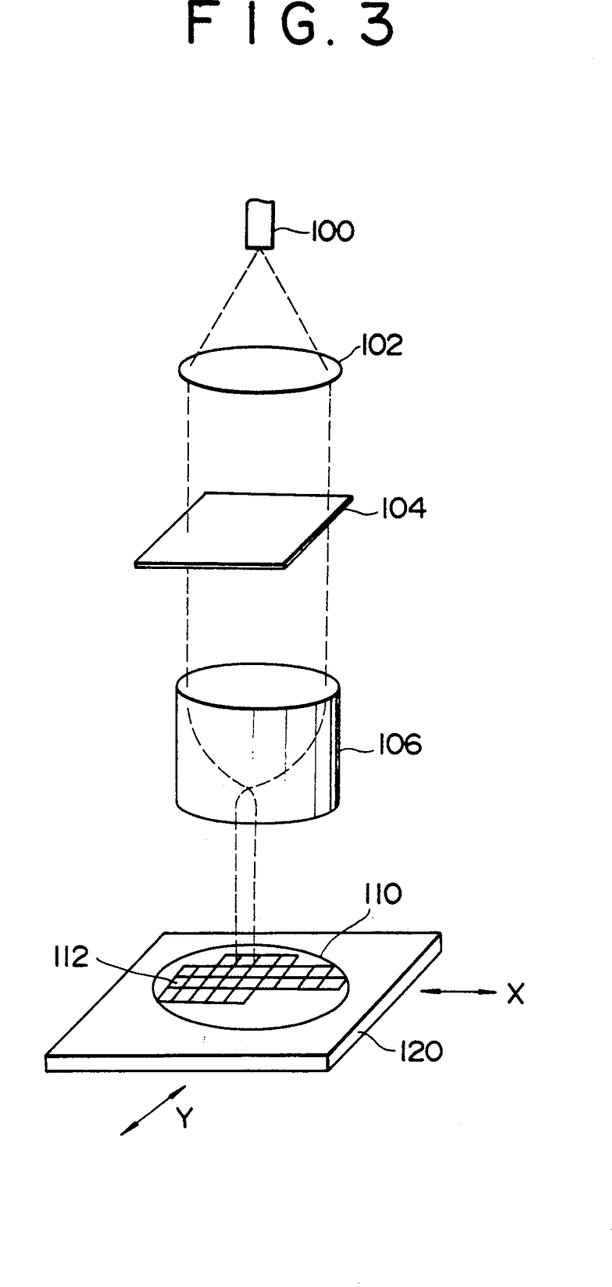
FIG. 3 is a perspective view showing an exposure process using the photomask.

FIG. 3 shows how a wafer is exposed by using the photomask described above. A mercury lamp 100 is an exposing source to project an i-ray, for example. The light from the exposing source 100 is converted by a condenser lens 102, being incident onto the photomask 104 (of FIG. 1(A)), and projected onto one of chips 112 of a wafer 110 through a projecting reduction lens 106. The wafer 110 is placed on a wafer stage 120, and is moved in the directions X and y in a stepped manner so that all the chips 112 can be serially exposed.

FIGS. 4(A) to 4(D) show a sequence of the photolithography including the exposing process.

Figure 4A:
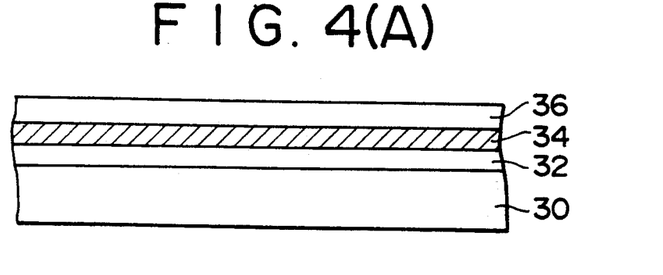
FIGS. 4(A) to 4(D) show a lithographic process using the photomask.
Figure 4B:
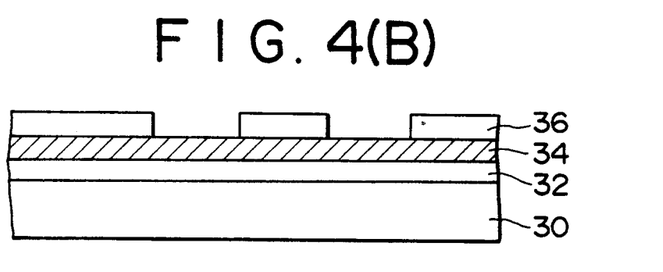
Figure 4C:
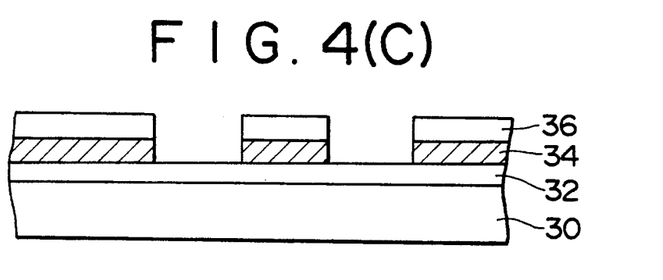
Figure 4D:
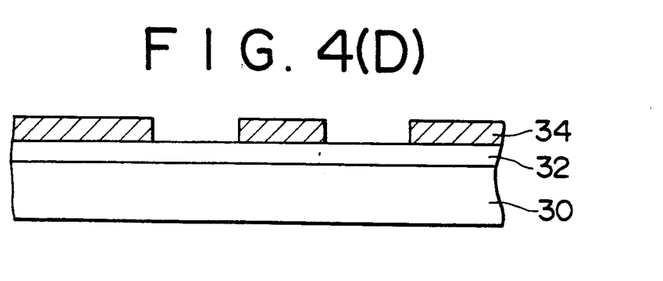

As shown in FIG. 4(A), the wafer includes a semiconductor substrate 30 (Si), an oxidized silicon film 32 ($SiO_2$) superimposed on the substrate 30, and a polycrystalline silicon film 34 (poly-Si) on the oxidized silicon 32. The polycrystalline silicon film 34 is etched later. A resist 36 is applied over the polycrystalline silicon film 34 by spincoating. Then, the wafer is exposed through the photomask 104 as shown in FIG. 3 and is developed to remove the resist 36 from the etched areas as shown in FIG. 4(B). Since the resist 36 at the areas associated with the chromium patterns 22 (of FIG. 1) is completely shielded, the resist 36 has very sharp edges. The polycrystalline silicon layer 34 is then dry-etched by using the resist 36 as a mask, being shaped into a desired pattern (FIG. 4(D)).

Figure 5:
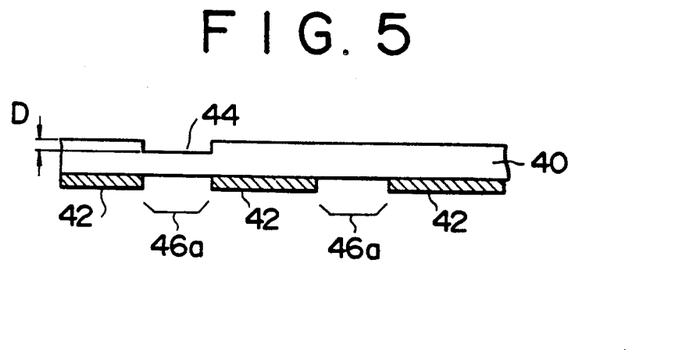
FIG. 5 is a cross-sectional view of a photomask which is made by etching a rear surface of a mask substrate, according to a second embodiment of this invention.

FIG. 5 is a cross-sectional view of a photomask according to a second embodiment of this invention. A mask substrate 40 has chromium patterns 42 on its one surface, and a shifter 44 formed on the other surface, i.e. on the opposite surface of the light passing region 46a. The light passing region 46a has a shorter optical path than the optical path of the light passing region 46b, thereby shifting the phase of light. This photomask is fabricated similarly to the photomask of the first embodiment of FIG. 1, except for the position of the mask substrate to be etched to form the shifter 44.

In this embodiment, even when the mask substrate 40 is etched wider than the light passing region 46a, the chromium patterns 42 can shield light sufficiently. Therefore, so strict requirement is not made on the width of the mask substrate 40 to be etched. Although side edges of the chromium patterns 22 are sometimes etched in the embodiment of FIG. 1, the side edges of the chromium patterns 22 are never etched in the second embodiment, so that the photomask having a very high resolution can be realized.

Figure 6A:
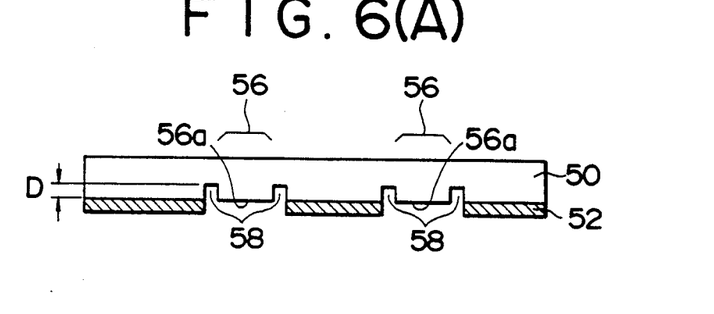
FIGS. 6(A) to (C) respectively show a cross section of a photomask with edge-emphasized type shifters according to a third embodiment of this invention, and properties of light passing through the photomask.
Figure 6B:
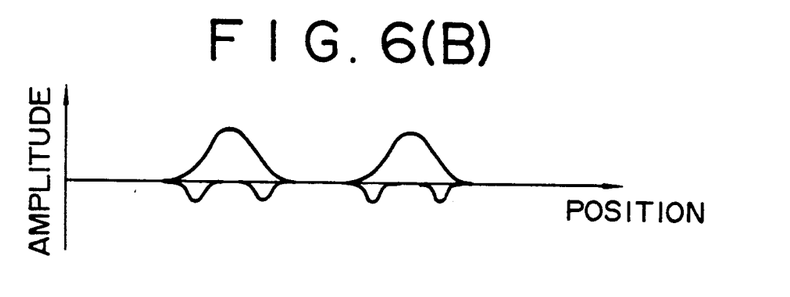
Figure 6C:
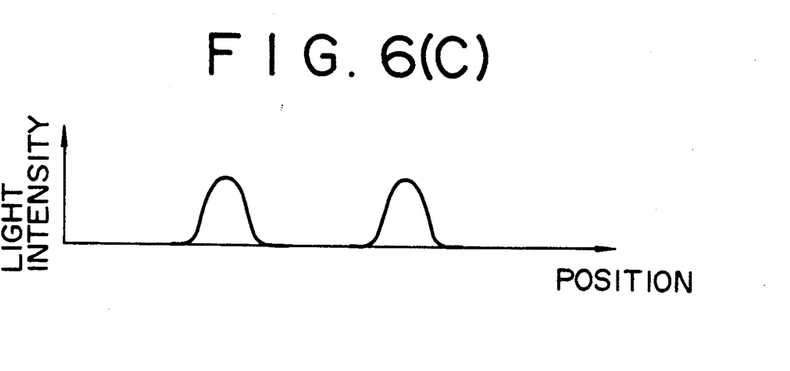

FIGS. 6(A) to 6(C) show a photomask having edge emphasized shifters. A substrate 50 has chromium patterns 52 and light passing regions 56 56 interposed between the chromium patterns 52 as described in the foregoing embodiments. Each light passing region 56 has shifters 58 at its opposite edges adjacent to the chromium patterns 22. The shifters 58 are formed by etching the mask substrate 50 to a depth D. The phase of the light passing through the shifters 58 are displaced by 180 degrees compared with the phase of the light passing through the centers 56a of the light passing regions 56 (FIG. 6(B)). Therefore, the edges of light passing through the shifters 58 are intensified as shown in FIG. 6(C). Since the mask substrate 50 is etched to form the shifters 58, the fabrication process is simplified compared with a case in which a shifter is made by applying SOG.

Figure 7:
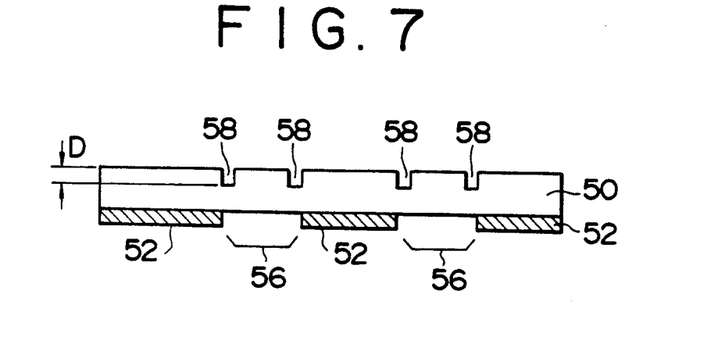
FIG. 7 is a cross-sectional view of a photomask having shifters etched on the rear surface of the mask substrate according to a fourth embodiment.

In an embodiment of FIG. 7, shifters 58 are formed on the rear surface of the mask substrate 50 opposite to where the chromium patterns 52 are mounted. Even if each shifter 58 is etched wider than each chromium pattern 52, the chromium pattern 52 can shield light sufficiently. Therefore, the requirement of the etching width is not so strict. There is also no possibility of side etching of the chromium patterns 52, so that the photomask can assure higher resolution.

Figure 8A:
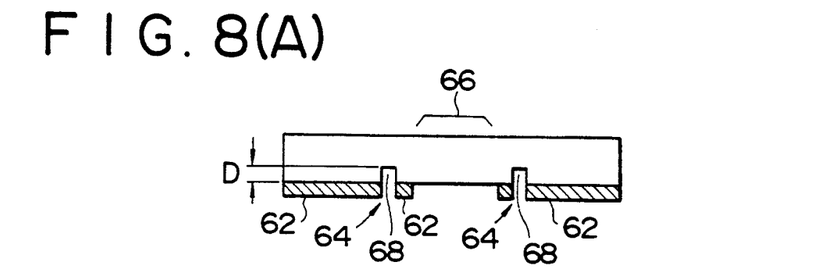
FIGS. 8(A) to (C) respectively show a cross section of a photomask with auxiliary shifters according to a fifth embodiment, and properties of light passing through the photomask.
Figure 8B:
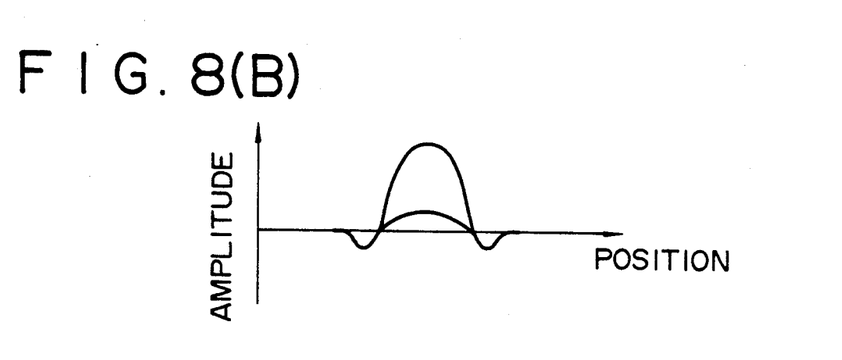
Figure 8C:
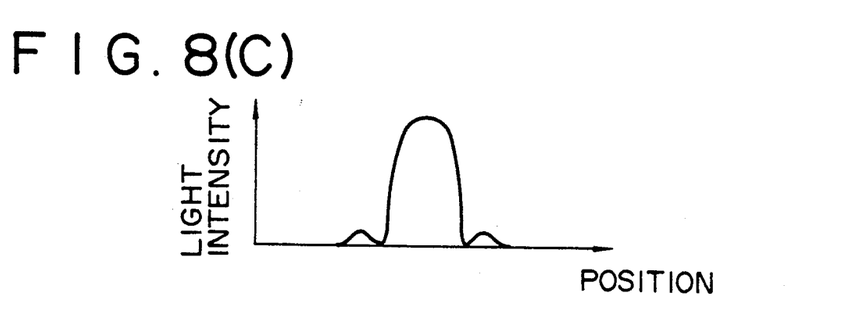

FIGS. 8(A) to 8(C) show a photomask with auxiliary shifters according to a further embodiment of this invention. The photomask includes a mask substrate 60, chromium patterns 62 formed on the mask substrate 60, and main light passing regions 66 by opposite edges of the chromium patterns 62. Each of the chromium patterns 62 has non-patterned regions near its opposite edges. These non-patterned regions serve as auxiliary light passing regions 64. Shifters 68 are formed in the auxiliary light passing regions 64 by thinning the substrate 60. Since rays of light having the phase 180°-shifted from the phase of the light passing via the main light passing regions 66 are superimposed in the shifters 68, no light caused by the diffraction effect reaches the chromium patterns 52 (FIGS. 8(A) and 8(C)).

Figure 9:
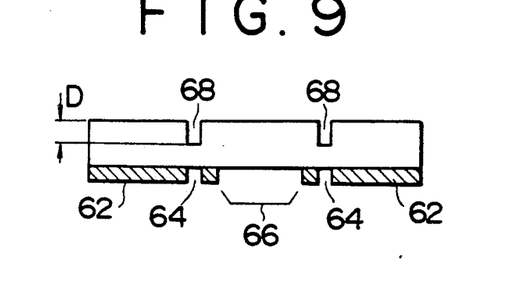
FIG. 9 is a cross-sectional view of a photomask having a shifter etched on the rear surface of the mask substrate according to a sixth embodiment.

In sixth embodiment shown in FIG. 9, a photomask is similar to the photomask of the fifth embodiment except for shifters 68, which are formed on the rear surface of the mask substrate 60. Even when a large area is etched for the shifters 68, the chromium patterns 62 can shield the light sufficiently. The requirement for the etching width is not so strict. Since there is no possibility of side etching of the chromium patterns 62, the photomask can assure improved resolution.

Figure 10A:
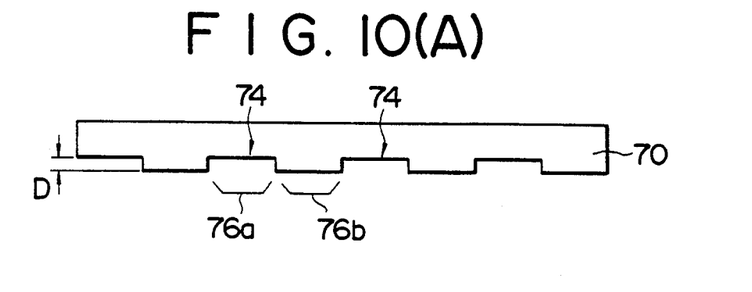
FIGS. 10(A) to 10(C) respectively show a cross section of a photomask without light shielding layer according to a seventh embodiment, and properties of light passing through the photomask.
Figure 10B:
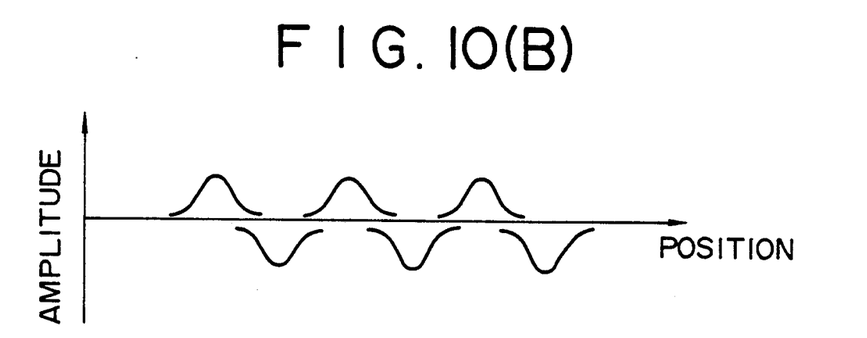
Figure 10C:
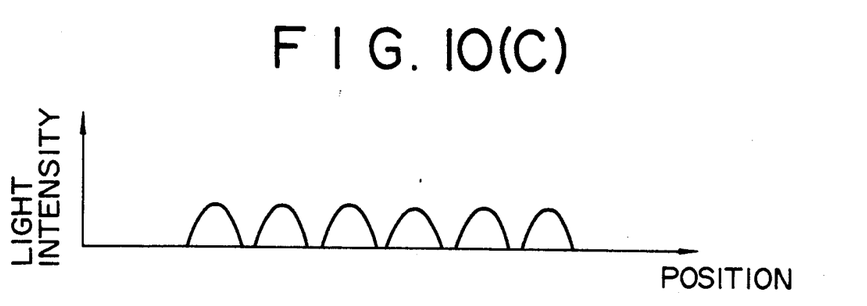

FIGS. 10(A)-10(C) shows a photomask without chromium patterns according to a seventh embodiment of this invention. The photomask includes a substrate 70, light passing regions 76a, shifters 74 formed by etching the substrate 70 to a depth D, and light passing regions 76b which are as thick as the substrate 70. Rays of light passing through these two light passing regions 76a, 76b have phases which are differentiated by 180°.

Since each light passing region 76a has a shifter 74, its optical path is shorter than the optical path through the light passing region 76b, so that the phase of light can be shifted 180° (FIG. 10(B)). Intensity of the light passing through the border between the light passing regions 76a, 76b becomes zero since amplitudes of two rays of light having the phase shift are offset at a portion where these rays of light are superimposed, so that desired patterns can be formed (FIG. 10(C)). The shifters 74 can be made by etching the mask substrate 70 itself without using the chromium patterns. Thus the shifters can be made by less fabrication steps compared with the method using the chromium patterns.

What is claimed is:

1. A photomask with a phase shifter, comprising:
   (a) a mask substrate made of material passing exposing light;
   (b) a light shielding layer made of material shielding the exposing light, said light shielding layer being in the shape of light shielding patterns on the said mask substrate;
   (c) light passing regions positioned beside each of said light shielding patterns on said mask substrate
   (d) a phase shifter positioned at a small thickness portion of said mask substrate and associated with one of said light passing regions, said phase shifter shifting the phase of the exposing light by differentiating lengths of optical paths through said light passing regions, wherein said phase shifter is a recess on said mask substrate on a surface opposite to the surface where said light shielding layer is positioned, being associated with one of said light passing regions, and wherein a depth D of said phase shifter is given by $$D = (100 \pm 5.56\% \times \lambda / [2 \times (n_1 - n_2)]$$

where $\lambda$ is a wavelength of the exposing light, $n_1$ is a refractive index of said mask substrate, and $n_2$ is a refractive index of an ambience around said photomask.

2. A photomask according to claim 1, wherein the exposing light is an i-ray of a mercury lamp.

3. A photomask with a phase shifter, comprising:
   (a) a mask substrate made of material passing exposing light; and
   (b) a phase shifter positioned at a small thickness portion of said mask substrate and having an optical path shorter than the remaining portion of said mask substrate to shift the phase of the exposing light; and
   whereby intensity of the exposing light passing through a border between said phase shifter and the remaining portion of said substrate is decreased to form an exposed pattern without the use of a light shielding layer.

4. A photomask according to claim 3, wherein said phase shifter is a recess in the shape of a pattern on said mask substrate, and wherein a depth D of said phase shifter is given by $$D = (100 \pm 5.56\% \times \lambda / [2 \times (n_1 - n_2)]$$

where $\lambda$ is a wavelength of the exposing light, $n_1$ is a refractive index of said mask substrate, and $n_2$ is a refractive index of an ambience around said photomask.

5. A photomask according to claim 4, wherein the exposing light is an i-ray of a mercury lamp.

6. A photomask with edge-emphasized phase shifters, comprising:
   (a) a mask substrate made of material passing exposing light;
   (b) a light shielding layer made of material shielding the exposing light, said light shielding layer being in the shape of light shielding patterns on said mask substrate;
   (c) light passing regions positioned beside said light shielding patterns on said mask substrate;
   (d) a plurality of phase shifters positioned at small thickness portions of said mask substrate and at positions associated with opposite edges of each said light passing region to differentiate length of an optical path through the central portions of said light passing regions and to shift the phase of light at said edges of each said light passing region; and
   wherein said phase shifter is a recess on said mask substrate on a surface opposite to the surface where said light shielding layer is mounted, being associated with one of said light passing regions, and wherein a depth D of said phase shifter is given by $$D = (100 \pm 5.56\% \times \lambda / [2 \times (n_1 - n_2)]$$

where $\lambda$ is a wavelength of the exposing light, $n_1$ is a refractive index of said mask substrate, and $n_2$ is a refractive index of an ambience around said photomask.

7. A photomask with auxiliary shifters, comprising:
   (a) a mask substrate made of material passing exposing light;
   (b) a light shielding layer made of material shielding the exposing light, said light shielding layer being in the shape of light shielding patterns on said mask substrate;
   (c) main light passing regions located outside opposite side edges of said light shielding patterns on said mask substrate;
   (d) auxiliary light passing regions located inside opposite side edges of each said light shielding patterns;
   (e) a plurality of phase shifters, each of said phase shifters being located at a small thickness portion of said mask substrate associated with each said auxiliary light passing regions so that a phase of light at said auxiliary light passing regions is shifted due to difference of optical path length through each of said phase shifters; and
   wherein said phase shifter is a recess on said mask substrate on a surface opposite to the surface where said light shielding layer is mounted, being associated with one of said light passing regions, and wherein a depth D of said phase shifter is given by $$D = (100 \pm 5.56\% \times \lambda / [2 \times (n_1 - n_2)]$$

where $\lambda$ is a wavelength of the exposing light, $n_1$ is a refractive index of said mask substrate, and $n_2$ is a refractive index of an ambience around said photomask.

8. A method of fabricating a semiconductor device, comprising the steps of:
   providing a photomask comprising a mask substrate made of material passing exposing light, a light shielding layer made of material shielding the exposing light, said light shielding layer being in the shape of a light shielding pattern on said mask substrate, light passing regions positioned beside said light shielding pattern on said mask substrate, a phase shifter positioned at a small thickness portion of said mask substrate associated with one of said light passing regions, said phase shifter shifting the phase of the exposing light by differentiating lengths of optical paths through said light passing regions, wherein said phase shifter is a recess on said mask substrate on a surface opposite to the surface where said light shielding layer is mounted; and
   exposing light to a resist coated on an etched layer of a semiconductor substrate through the photomask.

9. A method according to claim 8, wherein the exposing light is an i-ray of a mercury lamp.

10. A method of fabricating a semiconductor device, comprising the steps of:
    providing a photomask comprising a mask substrate made of material passing exposing light, a phase shifter positioned at a small thickness portion of said mask substrate and having an optical path shorter than the remaining portion of said mask substrate to shift the phase of the exposing light, and whereby intensity of light passing through a border between said phase shifter and the remaining portion of said substrate is decreased to form an exposed pattern without the use of a light shielding layer; and
    applying exposing light to a resist coated on an etched layer of a semiconductor substrate through the photomask.

11. A method according to claim 10, wherein the exposing light is an i-ray of a mercury lamp.

12. A method of fabricating a semiconductor device, comprising the steps of:
    providing a photomask comprising a mask substrate made of material passing exposing light, a light shielding layer made of material shielding the exposing light, said light shielding layer being in the shape of a light shielding pattern on said mask substrate, light passing regions positioned beside said light shielding pattern on said mask substrate, a plurality of edge-emphasized phase shifters positioned at small thickness portions of said mask substrate and at positions associated with opposite edges of each of said light passing regions to differentiate length of an optical path through the central portions of said light passing regions and to shift the phase of light at said edges of each of said light passing regions, wherein said phase shifter is a recess on said mask substrate on a surface opposite to the surface where said light shielding layer is mounted; and
    applying exposing light to a resist coated on an etched portion of a semiconductor substrate through the photomask.

13. A method of fabricating a semiconductor device, comprising the steps of:
    providing a photomask comprising a mask substrate made of material passing exposing light, a light shielding layer made of material shielding the exposing light, said light shielding layer being in the shape of light shielding pattern on said mask substrate, main light passing regions located outside opposite side edges of said light shielding pattern on said mask substrate auxiliary light passing regions located inside opposite side edges of said light shielding pattern, a plurality of phase shifters, each of said phase shifters being located at a small thickness portion of said mask substrate associated with each of said auxiliary light passing regions so that phase of light at said auxiliary light passing regions is shifted due to difference of optical path length through each of said phase shifters, a plurality of auxiliary phase shifters, wherein said phase shifter is a recess on said mask substrate on a surface opposite to the surface where said light shielding layer is mounted; and applying exposing light to a resist coated on an etched layer of a semiconductor substrate through the photomask.

* * * * *